United States Patent [19]
Tomita et al.

[11] Patent Number: 5,637,917
[45] Date of Patent: Jun. 10, 1997

[54] LEAD FRAME ASSEMBLY FOR A SEMICONDUCTOR DEVICE

[75] Inventors: Yoshihiro Tomita; Michitaka Kimura; Yoshihiro Kashiba, all of Tokyo, Japan

[73] Assignee: Mitsubishi Denki Kabushiki Kaisha, Tokyo, Japan

[21] Appl. No.: 626,956

[22] Filed: Apr. 3, 1996

[30] Foreign Application Priority Data

Sep. 20, 1995 [JP] Japan .................................. 7-241776

[51] Int. Cl.⁶ .................................................. H01L 23/495
[52] U.S. Cl. .................................... 257/676; 361/813
[58] Field of Search .............................. 257/669, 676, 257/672, 666, 691, 674, 670; 361/813

[56] References Cited

U.S. PATENT DOCUMENTS

| | | | |
|---|---|---|---|
| 5,389,818 | 2/1995 | Inoue et al. ............................. | 257/676 |
| 5,394,751 | 3/1995 | Ishibashi ................................. | 257/676 |
| 5,535,509 | 7/1996 | Tomita et al. . | |

FOREIGN PATENT DOCUMENTS

| | | | |
|---|---|---|---|
| 0269336 | 6/1988 | European Pat. Off. ............... | 257/676 |
| 52-12573 | 1/1977 | Japan ..................................... | 257/676 |
| 57-66656 | 4/1982 | Japan ..................................... | 257/676 |
| 7133655 | 8/1982 | Japan ..................................... | 257/676 |
| 58-48953 | 3/1983 | Japan ..................................... | 257/669 |
| 0147063 | 2/1989 | Japan ..................................... | 257/676 |
| 5190720 | 7/1993 | Japan . | |
| 5343445 | 12/1993 | Japan . | |

Primary Examiner—Sara W. Crane
Assistant Examiner—Phat X. Cao
Attorney, Agent, or Firm—Leydig, Voit & Mayer

[57] ABSTRACT

A lead frame assembly for a semiconductor device includes a lead frame having a lead frame main body and a first welding region, and a die pad frame having a die pad frame main body, a die pad frame, and a second welding region for welding to the first welding region of said lead frame main body. At least one of the first and second welding regions includes a welding pad for welding to the other welding region and a support bridge connected between the welding pad and a respective frame main body, supporting the welding pad from the respective frame main body, the support bridge including an element for suppressing transmission of at least one of mechanical force, heat, and electrical current.

11 Claims, 8 Drawing Sheets

LEAD FRAME ASSEMBLY FOR A SEMICONDUCTOR DEVICE

BACKGROUND OF THE INVENTION

This invention relates to a lead frame assembly having two welded frames for use in a semiconductor device of the lead on chip (LOC) structure in which the leads extend over the semiconductor chip.

Figure 10A:
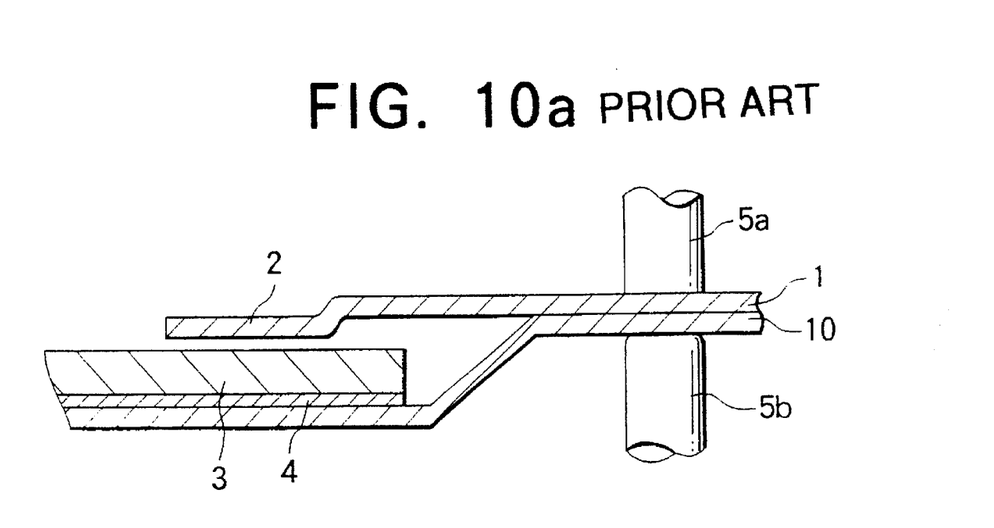
FIG. 10a is a fragmental sectional view showing a lead frame and a die pad frame of a conventional lead frame assembly held together between welding electrodes before welding.

A conventional lead frame assembly for a semiconductor device of the LOC structure comprises a die pad frame having a die pad and a lead frame having leads resistance welded together as disclosed in Japanese Patent Laid-Open No. 5-343445. In FIG. 10a, which illustrates one example of this structure, reference numeral 1 is a lead frame, 2 are leads, 3 is a semiconductor chip, 4 is a bonding agent such as solder, 5a and 5b are a pair of electrodes, and 10 is a die pad frame. Resistance welding is a well-known method in which the welding regions are held under pressure between two electrodes 5a and 5b and an electric current is supplied therethrough to melt the welding regions of the frames 1 and 10 by Joule heating to weld them together. This welding method is advantageous in that two frames can be joined together quickly with a simple apparatus.

Japanese Patent Laid-Open No. 5-190720 discloses a method for bonding two frames into a frame assembly through the use of an energy beam such as a laser beam. In this method, a large pressure is not necessary, so that the deformation of the frame assembly due to the pressure is eliminated.

Figure 10B:
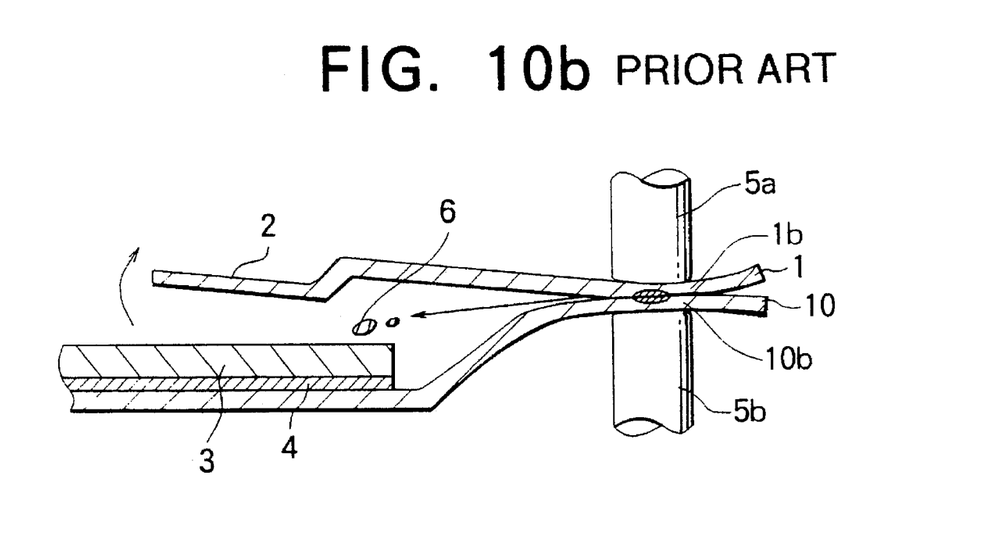
FIG. 10b is a fragmental sectional view showing the lead frame and the die pad frame of the conventional lead frame assembly being welded under pressure by the welding electrodes.

Since the frame 1 and/or 10 held together under pressure are melted by an electrical current in resistance welding, several problems occur. The frame assembly during welding is illustrated in FIG. 10b, in which the reference numeral 6 designates molten debris scattering from the molten portion of the frame and 1a and 10b designate bonding regions.

First, the frame 1 or 10 may be deformed or distorted during the welding process. That is, if the lead frame 1 and the die pad frame 10 are displaced relative to each other during the welding by several μm parallel to the frames, the frame assembly is deformed into a convex or concave shape on the order of 100 μm. In particular, after the entire welding steps are completed, the frame assembly as a whole has a large deformation due to the accumulated deformations and distortions. When such deformations are generated in the frame assembly, the next wire bonding process cannot be properly achieved due to the lead dislocation and insufficient heating of the die pad, resulting in a poor yield in the wire bonding process.

Second, the molten debris 6 scatters due to the abrupt change in temperature during welding. The molten debris 6 moves between the frames at a high speed and scatters outwardly in a molten state. When this high temperature molten debris 6 deposits on the semiconductor chip 3, the organic coating on the semiconductor chip 3 is melted and the circuit is short circuited, decreasing the yield of the manufactured semiconductor device. Also, if this molten debris 6 attaches to the electrode on the semiconductor chip 3, although this is not frequent, the wire bonding process cannot be satisfactorily performed.

Figure 11:
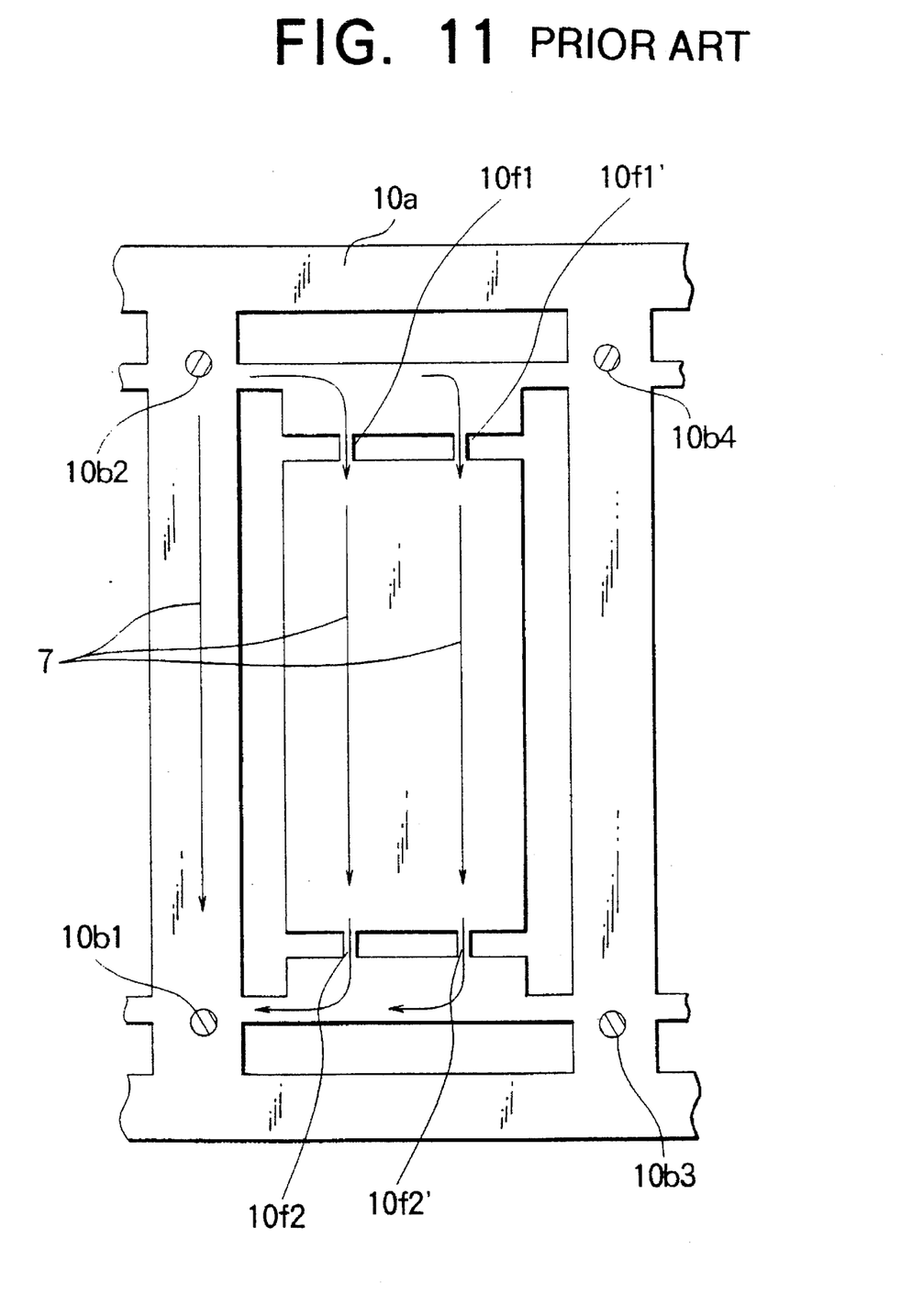
FIG. 11 is a fragmental plan view of a conventional lead frame assembly with electrical currents shown by arrows.

Third, as illustrated in FIG. 11 which shows a flow of a shunted electrical current 7 during welding, a welding region 10b, first, second, third and fourth welding regions 10b1, 10b2, 10b3, and 10b4, respectively. When the first welding region 10b1 is to be welded, since the lead frame 1 and the die pad frame 10 are not yet electrically connected, an electrical current which is on the order of 500 A flows between the electrodes 5a and 5b shown in FIG. 10 and the shunted current is equal to or less than 1 A. However, when the second welding region 10b2 is to be bonded, since the frames to be welded are electrically connected together by the first welding region 10b1, an electrical current easily flows through the frame and, as shown in FIG. 11 at the arrow 7, one portion of the current flowing through the frame during the welding is shunted into the die pad (not shown) through the die pad support pins 10f1, 10f1' and also flows into the lead frame 1 through the die pad support pins 10f2 and 10f2' and through the first welding region 10b1. This current is of the order of 10 A, which may be sufficiently large to destroy the semiconductor chip.

On the other hand, with the laser welding method, while the problem of the chip destruction by the shunted current is solved since no electrical current is used as the energy source, other problems cannot be solved and unfortunately a larger amount of the scattering molten debris is generated in laser welding.

Accordingly, an object of the present invention is to provide a lead frame assembly in which a lead frame and a die pad frame are welded together and which is free from the above-mentioned problems of the conventional lead frame assembly.

Another object of the present invention is to provide a welded lead frame assembly in which deformation of the frame assembly is eliminated.

Another object of the present invention is to provide a welded lead frame assembly in which deformation of the frame assembly is eliminated and scattering of the molten weld debris onto the semiconductor chip can be eliminated.

Still another object of the present invention is to provide a welded lead frame assembly in which deformation of the frame assembly is eliminated and the scattering of the molten weld debris onto the semiconductor chip can be eliminated and in which the flow of electrical current into the die pad can be eliminated.

A further object of the present invention is to provide a welded lead frame assembly which is high in manufacturing yield and reliable.

With the above objects in view, the present invention resides in a lead frame assembly for a semiconductor device which comprises a lead frame and a die pad frame welded together. The lead frame includes a lead frame main body, at least one lead extending from the main body and a first welding region disposed to the lead frame. The die pad frame includes a die pad frame main body, at least one die pad supported from the die pad frame main body on which a semiconductor element is to be mounted and a second welding region disposed to the die pad frame main body and weld-bonded to the second welding region of the lead frame main body. At least one of the first and second welding regions comprise a welding pad welded to the other welding region and a support bridge connected between the welding pad and the frame main body for supporting the welding pad from the frame main body. The support bridge includes suppression means for suppressing transmission of at least one of mechanical force, heat and an electric current therethrough between the welding pad and the frame main body.

The lead frame assembly may further comprise a slit provided in the frame main body around the welding pad to substantially surround the welding pad, and the frame main body may have an inward facing edge in a spaced opposite relationship with respect to the welding pad. The support bridge may be connected between the welding pad and the inward side edge of the frame main body for supporting the welding pad from the frame main body.

The suppression means of the support bridge is a narrow width dimension of the support bridge which provides a resistance to the transmission of at least one of mechanical force, heat and electric current therethrough. The support bridge may have a bend for absorbing distortion of the welding region. The welding region may comprise a frame member having the inward facing edge which defines an outer boundary of the slit surrounding the welding pad.

The support bridge may be located, relative to the welding pad, on a side remote from the die pad to which the semiconductor element is to be mounted. The lead frame main body may comprise a lead frame member supporting the leads and disposed between the welding regions and have a rigidity greater than that of a frame member of the die pad frame corresponding to the lead frame member. The lead frame member of the die pad frame corresponding to the lead frame member may be provided therein with an expansible and contractible expansion section for absorbing the distortion.

The lead frame main body may comprise a lead frame member supporting the leads and the support bridge is separate from the lead frame member having the leads. The assembly may also comprise a barrier member disposed so that a plane containing at least a welded interface around the welding regions and a surface of the semiconductor chip is crossed. The barrier member may comprise a bent portion of the welding region frame located in the direction of scattering of the molten debris. The bent portion of the welding region frame defines a clearance between the lead frame and the die pad frame, and the barrier is positioned at an exit end of the clearance in the direction of movement of the molten debris.

The welding region may be located at about the midpoint between the opposing die pad support pins and, and the welding region may be located at about the midpoint between the opposing die pad support pins, and the impedances between the welding region and the pair of die pad support pins located at the opposite side with the die pad interposed therebetween may be made substantially equal to each other, so that the electrical potentials at each die pad support pins are equal to each other.

BRIEF DESCRIPTION OF THE DRAWINGS

The present invention will become more readily apparent from the following detailed description of the preferred embodiment of the present invention taken in conjunction with the accompanying drawings, in which.

DESCRIPTION OF THE PREFERRED EMBODIMENTS

Figure 1:
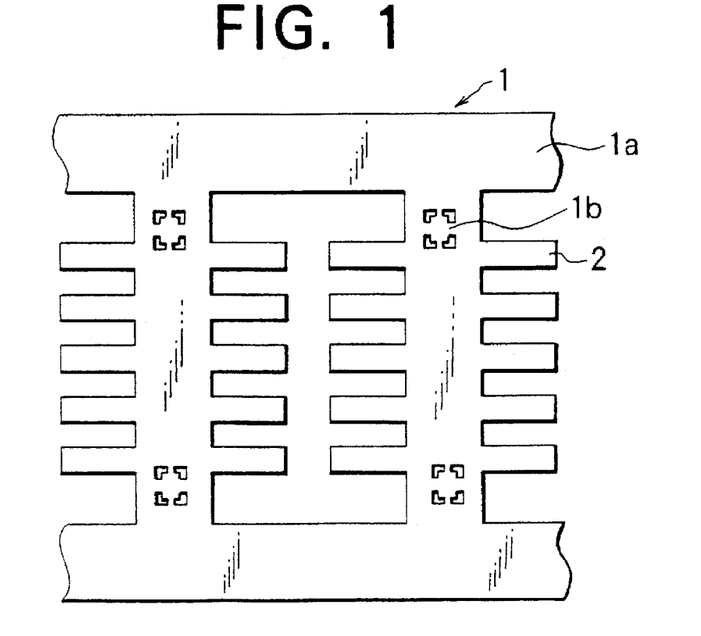
FIG. 1 is a schematic view for explaining a lead frame assembly for a semiconductor device of one embodiment of the present invention.
Figure 2:
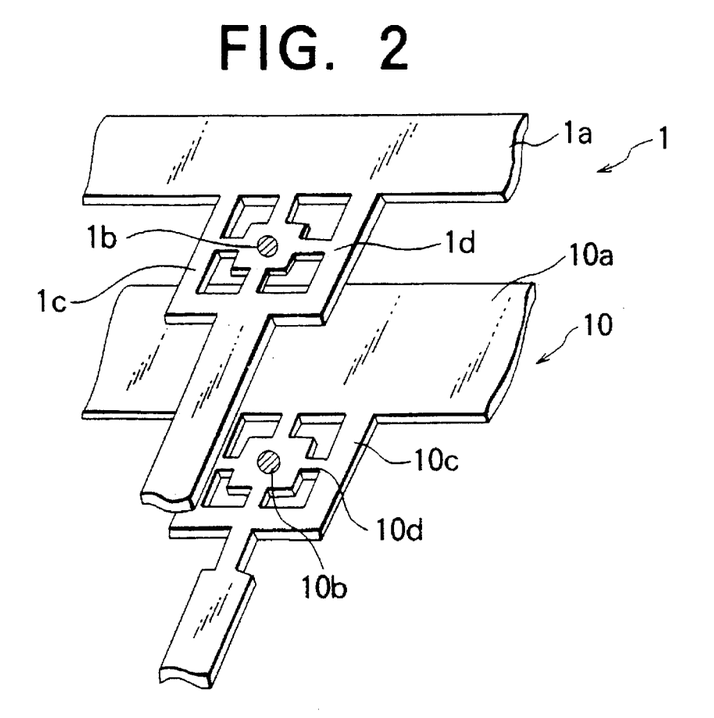
FIG. 2 is an enlarged perspective view of the welding regions of the lead frame and the die pad frame shown in FIG. 1.

FIGS. 1 and 2 illustrate embodiments of a lead frame assembly for a semiconductor device of the present invention. In FIGS. 1 and 2, the reference numeral 1 is a lead frame made of an Fe-Ni alloy, 1a is a frame main body, 1b is a welding region, 2 are a plurality of leads, 10 is a die pad frame made of an Fe-Ni alloy, 10a is a frame main body and 10b is a welding region. In FIG. 2, in which the welding regions 1b and 10b of the lead frame 1 and the die pad frame 10 have an island-shaped configuration, the reference numeral 1c is a welding region frame portion surrounding the island-shaped welding region 1b, 1d are support portions or support bridges connecting the welding region 1b and the welding region frame portion 1c together, 10c is a welding region frame portion surrounding the island-shaped welding region 10b, and 10d are support portions or support bridges connecting the welding region 10b and the welding region frame portion 10c.

Figure 3:
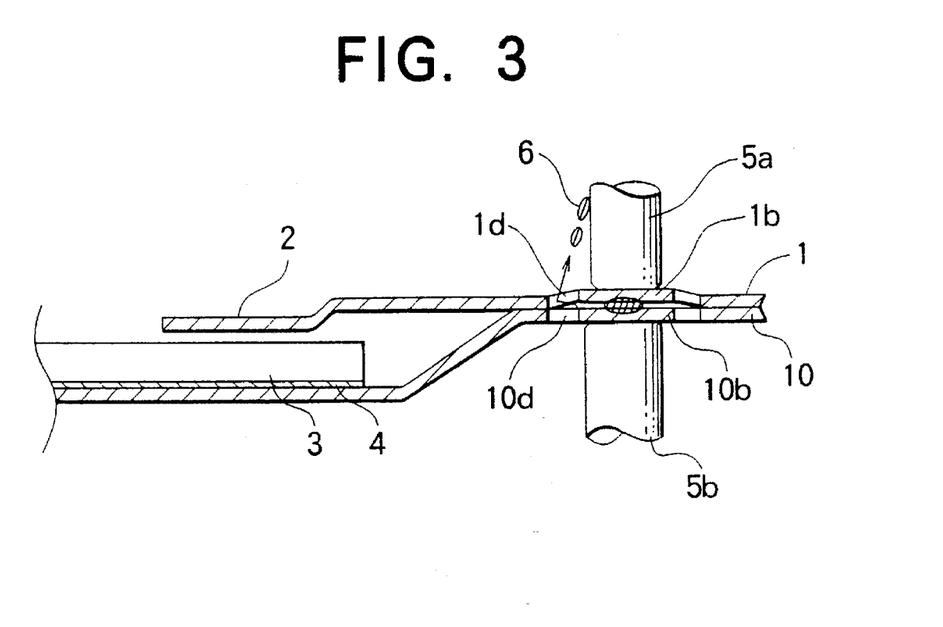
FIG. 3 is a fragmental sectional view of the welding region during welding of the lead frame assembly shown in FIG. 1.

FIG. 3 illustrates the state in which the resistance welding process is being achieved with respect to the lead frame assembly of the present invention shown in FIGS. 1 and 2. In this figure, the reference numeral 3 is a semiconductor chip, 4 is a bonding agent such as solder bonding the semiconductor chip 3 to the die pad frame 10, 5a and 5b are a pair of welding electrodes and 6 is molten debris generated at the welding point. When an electrical current is supplied to the welding regions 1b and 10b of the lead frame 1 and the die pad frame 10 held together under pressure between the electrodes 5a and 5b, the welding regions 1b and 10b are heated and start melting from the contacting interface. At this time, the distortion due to the generated heat is generated in the welding regions as is the conventional technique. However, in the lead frame assembly of the present invention, the welding regions are the island-shaped pads connected or supported by four narrow support bridges 1d or 10d, so that the distortion generated is limited to the island without being transmitted to the frame main body, whereby the frames 1 and 10 are ensured to maintain their overall precision dimensions.

Also, since the welding regions 1b and 10b are island-shaped, substantially surrounded by slits or the welding region frame 1c or 10c having an inner edge facing the island-shaped welding regions 1b or 10b, even when the molten debris 6 is generated and scattering, the molten debris 6 impinges upon the inner edge of the frame 1c or 10c facing toward the welding region 1b or 10b, whereby the molten debris 6 either changes its flying direction or attaches to the inner edge. Therefore, most of the molten debris 6 is prevented from flying onto the semiconductor chip 3, significantly reducing the probability of the molten debris 6 attaching to the semiconductor device and destroying the semiconductor device.

In order to efficiently cause the flying molten debris 6 to hit against the inner edge of the welding region frame 1c or 10c to thereby change its flying direction or to attach onto the inner edge, the length dimension of the space defined by the island-shaped welding region 1b or 10b and the welding region frame 1c or 10b should preferably be determined to have a suitable length. That is, when the length dimension of the space is too long, the flying debris 6 does not impinge the inner edge and directly flies onto the semiconductor chip 3. According to the experiments conducted by the inventors of the present invention, the length dimension of the space between the outer edge of the island-shaped welding region 1b or 10b for a lead frame having a thickness of from 0.125 mm to 0.15 mm should preferably be less than about 1 mm. With the length dimension equal to or more than 2 mm, the effectiveness of the inner edge facing toward the welding region is lost.

Figure 4:
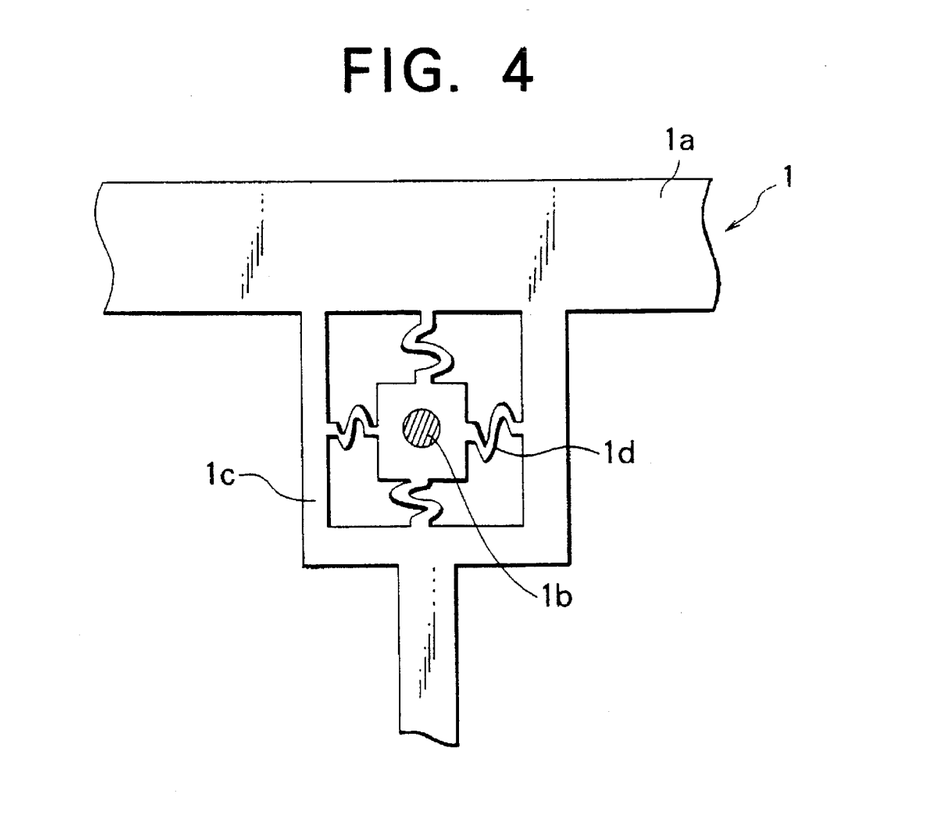
FIG. 4 is a fragmental plan view of a lead frame assembly for a semiconductor device of another embodiment of the present invention.

FIG. 4 illustrates another embodiment of the present invention. In this embodiment, as shown in FIG. 4, the support bridge 1d has a substantially S-shaped plan configuration, to easily absorb the distortion generated during welding even when the length dimension of the space between the welding region 1b and the welding region frame 1c is short and not sufficient for providing the support bridge with a length for absorbing the distortion of the welding region.

That is, while the support bridges which are expected to have a distortion absorbing function should preferably be thin and elongated so that they easily flex, the length dimension of the space defined by the island-shaped welding region 1b or 10b and the welding region frame 1c or 10b should preferably have a suitable length in order that the flying molten debris 6 surely hits against the inner edge of the welding region frame 1c or 10c to change its flying direction or attach to the inner edge. Therefore, if the length dimension of the support bridges is made simply sufficiently long to provide the necessary flexibility of the support bridges, then the space for the preventing the flying debris 6 from flying onto the semiconductor chip 3 become insufficient. Therefore, in this embodiment, the support bridges are formed into an S-shape as shown in FIG. 4, which allows the space between the welding region 1b and the welding region frame 1c to be maintained at a proper dimension, which ensures the bouncing or the attachment of the molten debris 6 and, at the same time, allows the effective length of the support bridges to absorb the distortion.

While the support bridges of the above embodiment are formed in an S-shape, another suitable serpentine or crank-shaped member having at least one bent portion for absorbing the distortion may equally be used. One example is a Z-shape. That is, at least one portion of the support bridge 1d may have an angle relative to the line perpendicular to the welding region frame. Also, while the S-shaped or Z-shaped support bridges 1d are provided in the welding region 1b of the lead frame 1, the support bridges 10d of the welding region 10b of the die pad frame may also be made into the S-shape or Z-shape.

Figure 5:
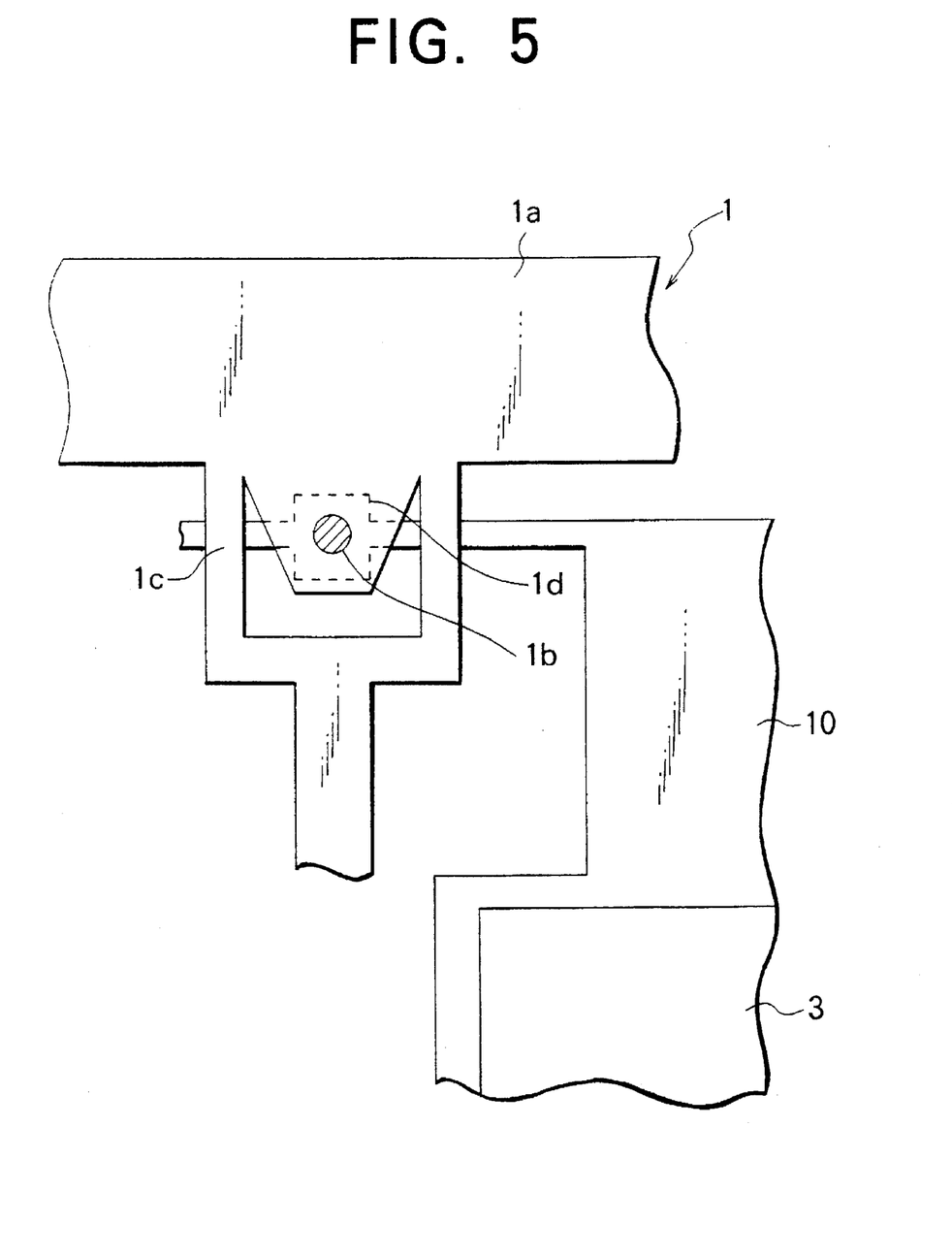
FIG. 5 is a fragmental plan view of a lead frame assembly for a semiconductor device of another embodiment of the present invention.

FIG. 5 illustrates another embodiment of the present invention in which the welding region 1b is provided with a wide support bridge 1d or support member on one side of the welding region 1b opposite to the semiconductor chip 3 for preventing the flying debris 6 from impinging and bouncing back at the inner edge facing the welding region and flying onto the semiconductor chip 3.

In the previous embodiments illustrated in FIGS. 1 to 5, the arrangement is such that the molten debris 6 scattered from the welding region 1b impinges upon the inner edge of the welding region. However, although the probability is small, the impinged debris 6 may bounce back toward the semiconductor chip 3 mounted on the die pad and may attach thereto.

This embodiment prevents this phenomenon by eliminating the slit surrounding the welding region 1b at a location opposite to the semiconductor chip 3 relative to the welding region 1b. According to this arrangement, the scattering debris 6 flying in the direction away from the semiconductor chip 3 does not hit the edge of the welding region frame and continues to move toward the outside of the frame main body 1a of the lead frame 1 so that it does not fly onto the semiconductor chip 3. Also, while the broad support bridge 1b is provided in the lead frame 1 in this embodiment, the broad support bridge 10b may also be provided in the die pad frame 10 at a location opposite to the mounted semiconductor chip 3 on the die pad.

Figure 6:
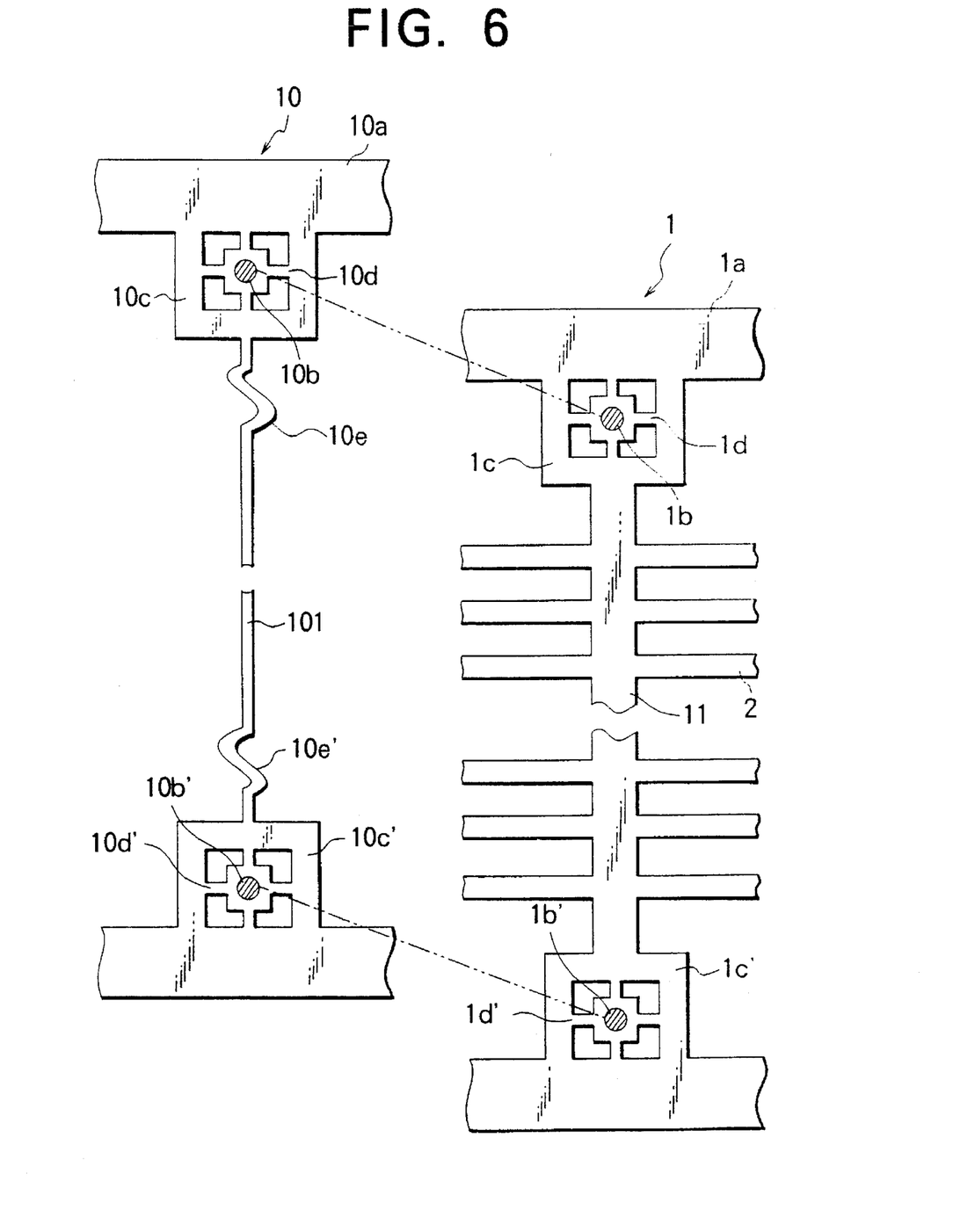
FIG. 6 is a plan view useful for explaining the relationship of a lead frame and the die pad frame of a lead frame assembly of a further embodiment of a present invention.

FIG. 6 illustrates a further embodiment of the lead frame assembly for a semiconductor device of the present invention which eliminates the problem of the distortion or deformation of the leads of the lead frame.

The lead frame assembly usually has more than twenty welding points for bonding the lead frame to the die pad frame and the lead frames is as thin as from 0.125 mm to 0.15 mm. Therefore, when they are welded at each welding point, the slight deformations or distortions in the frame are accumulated in a large distortion or deformation after the welding of the frames has been completed. This deformation of the lead frame involves the deformation or distortion of the leads, which affects the yields of the product after the wire bonding step.

Accordingly, this embodiment is arranged so that the distortion of the leads can be selectively suppressed. As shown in FIG. 6, the rigidity of the frame member 11 of the lead frame 1 from which the leads 2 extend is made greater than that of the frame member 101 of the die pad frame 10. In the illustrated embodiment, the frame members 11 and 101 are connected at their opposite ends to the respective welding region frames 1c and 10c, respectively, of the lead frame 1 and the die pad frame 10. Also, the frame member 101 of the die pad frame 10 is provided with flexible expansion sections 10e and 10e' in the shape of an S, for example. With this arrangement, the distortion generated at the welding regions is absorbed in the flexible expansion sections 10e and 10e' of the frame member 101 which is less rigid than the lead frame member 11 of the lead frame 1. Therefore, the lead frame 1 is maintained at a desired precise planarity and at a precise positional accuracy, greatly improving the wire-bonding yield.

When the frame member 11 of the lead frame 1 is made less rigid than the die pad frame 10, although convex or concave deformation of the frame does not occur, the leads 2 disadvantageously tilt with respect to the plane of the lead frame 1. Therefore, the rigidity of the frame member 11 between the welding regions 1b and 1b' should be greater than the rigidity of the frame member 101 of the die pad frame 10 corresponding to the frame member 11 and at least one portion of the frame member 101 between the welding regions 10b and 10b' of the die pad frame 10 should be expandable.

Figure 7:
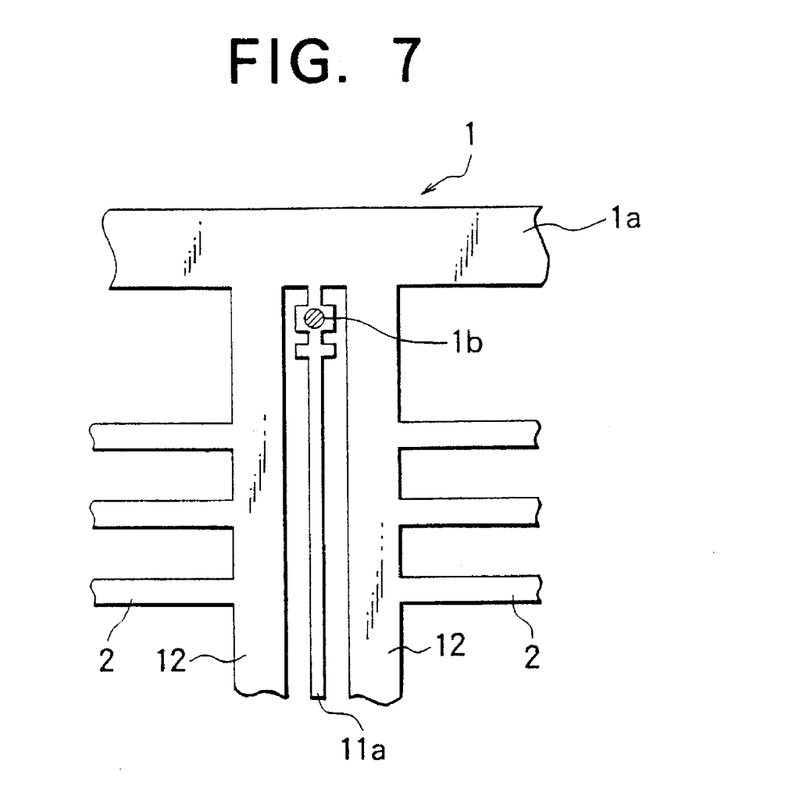
FIG. 7 is a fragmental plan view of a lead frame assembly for a semiconductor device of a still another embodiment of the present invention.

FIG. 7 illustrates another embodiment of the lead frame assembly of the present invention in which a similar problem is solved. In this embodiment, the lead frame 1 is provided with a lead support member 12 for supporting the leads 2 of the lead frame 1 as well as a welding region supporting frame member 11a for supporting the welding region 1b as a separate member from the lead support frame member 12. In this structure, the welding region 1b and the leads 2 are supported by the respective separate frame members 12 and 11a. Therefore, the distortion of the leads 2 which becomes a problem at the time of assembly can be supressed. Also, a flexible expansion section 10e or 10e' as shown in FIG. 6 may be advantageously provided in the welding region support frame member 11a in this embodiment.

Figure 8:
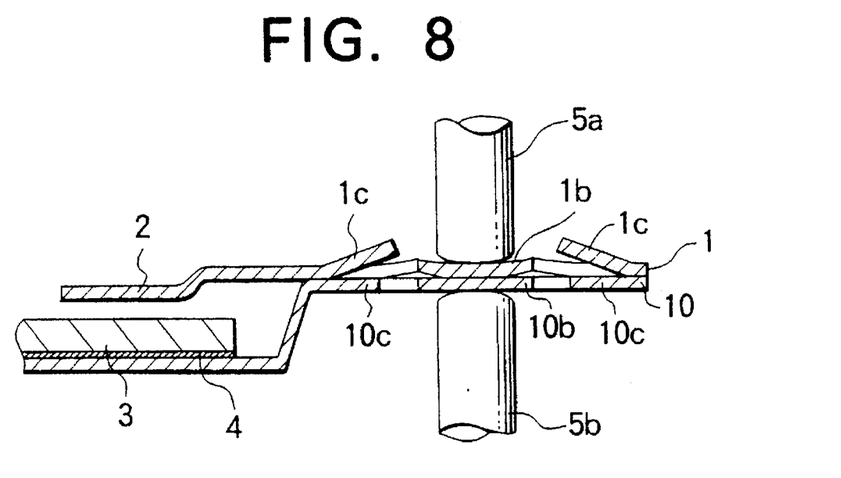
FIG. 8 is a fragmental sectional view of the welding region of a lead frame assembly for a semiconductor device of another embodiment of the present invention.

FIG. 8 illustrates a still another embodiment of the lead frame assembly of the present invention. In order to efficiently capture and return the scattering molten debris 6 generated during welding, a barrier member is disposed crossing a plane containing at least a welded interface around the welding regions 1b and 10b and the front surface of the semiconductor chip 3. In this embodiment, the welding region frame 1c located in the direction of scattering of the molten debris 6 has a bent portion, for example, whereby a clearance is defined between the lead frame 1 and the die pad frame 10 and a barrier is positioned at the exit so that the molten debris 6 cannot pass through. This effectively prevents scattering of the molten debris 6 over the surface of the semiconductor chip 3. When the barrier is formed by bending the frame member as described, the molten debris 6 can be advantageously prevented from directly scattering over the surface of the semiconductor chip 3 irrespective of the thickness of the lead frame 1 and the distance from the welding region to the welding region frame member. The bend formed at the periphery of the welding region is effective for preventing scattering of the molten debris 6, but a distortion which results in differing weld strength is apt to be easily generated, so that it is preferable that the barrier be formed in the welding region frame member 1c.

Figure 9:
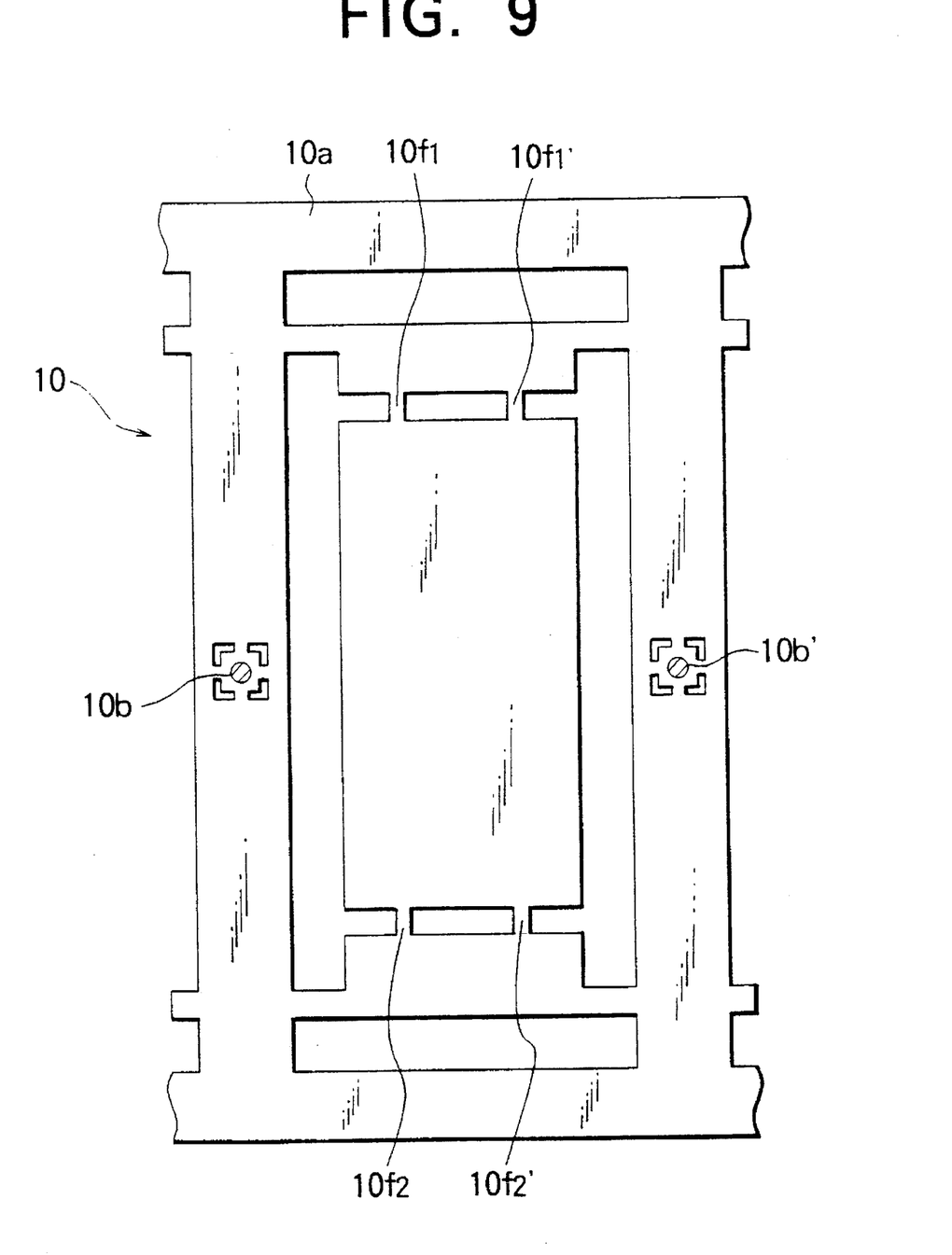
FIG. 9 is a fragmental plan view of the die pad frame of a lead frame assembly of another embodiment of the present invention.

FIG. 9 illustrates a further embodiment of the lead frame assembly for the semiconductor device of the present invention which is useful in preventing damage to the semiconductor chip due to the shunt current of the welding current. In FIG. 9, the reference numerals 10f1, 10f1', 10f2 and 10f2' are die pad support pins. In this embodiemnt, the welding region 10b is located at about the midpoint between the opposing die pad support pins 10f1 and 10f2, and the welding region 10b' is located at about the midpoint between the opposing die pad support pins 10f1' and 10f2'.

The impedance between the welding region 10b and the die pad support pin 10f1 close to this welding region 10b is made substantially equal to the impedance between the welding region 10b and the die pad support pin 10f2 (the die pad support pins 10f1 and 10f2 are in an opposing relationship with the die pad interposed therebetween). Also, the impedance between the welding region 10b' and the die pad support pin 10f1' close to this welding region 10b' is made substantially equal to the impedance between the welding region 10b' and the die pad support pin 10f2' (the die pad support pins 10f1' and 10f2' are in an opposing relationship with the die pad interposed therebetween).

In FIG. 9, when the welding region 10b on the left is to be welded after the completion of the welding of the welding region 10b' on the right, the electrical current flows also into the right hand welding region 10b' through the frame member. While this current is small as compared to the left hand current (about 500 A), it is sufficiently large to destroy the semiconductor chip as an electronic device. In the arrangement of this embodiment, the impedances between the welding region 10b and the pair of die pad support pins 10f1 and 10f2 located at the opposite side with the die pad interposed therebetween are made substantially equal to each other, so that the electrical potentials at each die pad support pins 10f1 and 10f2 are equal to each other. Therefore, the current does not flow deep into the die pad although it flows from the left side welding region 10b to the right side welding region 10b', so that damage to the semiconductor chip due to the electrical current can be prevented.

While the lead frame assemblies of the foregoing embodiments are explained as being made of an Fe-Ni alloy, similar advantageous results can be equally obtained for lead frames made of a Cu alloy or a combination of a Cu alloy and an Fe-Ni alloy instead of the Fe-Ni alloy. In particular, when a metal having a high electrical conductivity, such as a Cu alloy, which easily generates the molten debris is to be welded, the present invention which prevents the semiconductor chip from becoming damaged, even when the molten debris is generated is particularly useful.

It is also to be noted that while the welding regions of the embodiments shown in FIGS. 6 to 9 are island-shaped pads, the present invention is useful in eliminating the problem of the distortion even when the welding region frame is not provided.

We claim:

1. A lead frame assembly for a semiconductor device comprising:

a lead frame including a lead frame main body, at least one lead extending from said main body, and a first welding region; and a die pad frame including a die pad frame main body, at least one die pad supported from said die pad frame main body on which a semiconductor element is to be mounted, and a second welding region, at least one of said first and second welding regions comprising a peripheral welding pad frame, a welding pad for welding to the other of the welding regions and surrounded by said peripheral pad frame, and a support bridge connecting said welding pad to said peripheral welding pad frame for supporting said welding pad, said support bridge including means for suppressing transmission of at least one of mechanical force, heat, and electrical current between said welding pad and the one of said lead frame main body and die pad frame main body including said welding pad.

2. The lead frame assembly as claimed in claim 1, wherein said support bridge has a width that resists transmission of at least one of mechanical force, heat, and electrical current.

3. The lead frame assembly as claimed in claim 1, wherein said support bridge has a bend for absorbing distortion of said welding region.

4. The lead frame assembly as claimed in claim 1, wherein said support bridge is located, relative to said welding pad, remote from said die pad.

5. The lead frame assembly as claimed in claim 1, wherein said lead frame main body comprises a lead frame member supporting said leads and disposed between said welding regions and having a greater rigidity than a frame member of said die pad frame.

6. The lead frame assembly as claimed in claim 5, wherein said lead frame member of said die pad frame includes an expandable and contractible expansion section for absorbing mechanical distortion.

7. The lead frame assembly as claimed in claim 1, wherein said lead frame main body comprises a lead frame member supporting said leads and said support bridge is separate from said lead frame member.

8. A lead frame assembly for a semiconductor device comprising:

a lead frame including a lead frame main body, at least one lead extending from said main body, and a first welding region;

a die pad frame including a die pad frame main body, at least one die pad supported from said die pad frame main body on which a semiconductor element is to be mounted, and a second welding region, at least one of said first and second welding regions comprising a welding pad for welding to the other of the welding regions, and a support bridge connecting said welding pad to the one of said lead frame main body and said die pad frame main body including said welding pad, said support bridge supporting said welding pad from the one of said lead frame main body and said die pad frame main body including said welding pad, said support bridge including means for suppressing transmission of at least one of mechanical force, heat, and electrical current between said welding pad and the one of said lead frame main body and said die pad frame main body including said welding pad; and a barrier member crossing a plane containing a welding interface around the welding regions and a surface of a semiconductor chip mounted on said die pad.

9. The lead frame assembly as claimed in claim 8, wherein said barrier member comprises a bent portion of the welding region located in a direction of scattering of molten debris producing during welding.

10. The lead frame assembly as claimed in claim 9, wherein said bent portion of said welding region defines a clearance between said lead frame and said die pad frame, and said barrier is positioned at an exit end of said clearance in the direction of scattering of the molten debris.

11. A lead frame assembly for a semiconductor device comprising:

a lead frame including a lead frame main body, at least one lead extending from said main body, and a first welding region; and a die pad frame including a die pad frame main body, at least one die pad supported from said die pad frame main body on which a semiconductor element is to be mounted, and a second welding region, at least one of said first and second welding regions comprising a welding pad for welding to the other of the welding regions, and a support bridge connecting said welding pad to the one of said lead frame main body and said die pad frame main body including said welding pad, said supporting said welding pad from the one of said lead frame main body and said die pad frame main body including said welding pad, said support bridge including means for suppressing transmission of at least one of mechanical force, heat, and electrical current between said welding pad and the one of said lead frame main body and said die pad frame main body including said welding pad, wherein one of said welding regions is located about midway between one pair of die pad support pins at one end of the die pad and another of the welding regions is located about midway between another pair of die pad support pins at an opposite end of the die pad so that impedances between the welding regions and the pairs of die pad support pins located at opposite ends of the die pad are substantially equal to each other.

* * * * *

UNITED STATES PATENT AND TRADEMARK OFFICE
CERTIFICATE OF CORRECTION

PATENT NO. : 5,637,917
DATED : June 10, 1997
INVENTOR(S) : Tomita et al.

It is certified that error appears in the above-indentified patent and that said Letters Patent is hereby corrected as shown below:

Column 10, Line 17, after "said" (first occurrence)

insert --support bridge--.

Signed and Sealed this

Thirteenth Day of October 1998

Attest:

BRUCE LEHMAN

Attesting Officer

Commissioner of Patents and Trademarks